(12) United States Patent
Rhode et al.

(10) Patent No.: US 11,403,441 B2
(45) Date of Patent: Aug. 2, 2022

(54) METHOD FOR CHECKING A VEHICLE DYNAMICS MODEL

(71) Applicant: Robert Bosch GmbH, Stuttgart (DE)

(72) Inventors: Stephan Rhode, Karlsruhe (DE); Johannes Von Keler, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 150 days.

(21) Appl. No.: 16/925,662

(22) Filed: Jul. 10, 2020

(65) Prior Publication Data
US 2021/0042451 A1 Feb. 11, 2021

(30) Foreign Application Priority Data
Aug. 8, 2019 (DE) .......................... 102019211951.4

(51) Int. Cl.
G06F 30/20 (2020.01)
G06F 30/15 (2020.01)
G06N 7/00 (2006.01)

(52) U.S. Cl.
CPC ............... *G06F 30/20* (2020.01); *G06F 30/15* (2020.01); *G06N 7/005* (2013.01)

(58) Field of Classification Search
CPC .......... G06F 30/20; G06F 30/15; G06N 7/005
See application file for complete search history.

(56) References Cited

U.S. PATENT DOCUMENTS

2010/0318336 A1* 12/2010 Falangas ................. G06F 30/15
703/8
2019/0318051 A1* 10/2019 Oswald ................. G01M 17/00

OTHER PUBLICATIONS

Ao D, Hu Z, Mahadevan S. Dynamics model validation using time-domain metrics. Journal of Verification, Validation and Uncertainty Quantification. Mar. 1, 2017 ;2(1). (Year: 2017).*
Jo K, Chu K, Sunwoo M. Interacting multiple model filter-based sensor fusion of GPS with in-vehicle sensors for real-time vehicle positioning. IEEE Transactions on Intelligent Transportation Systems. Dec. 6, 2011;13(1):329-43. (Year: 2011).*
Maupin KA, Swiler LP, Porter NW. Validation metrics for deterministic and probabilistic data. Sandia Report (Year: 2017).*

(Continued)

*Primary Examiner* — Chuen-Meei Gan
(74) *Attorney, Agent, or Firm* — Norton Rose Fulbright US LLP; Gerard Messina

(57) ABSTRACT

A method for checking a vehicle dynamics model of a vehicle, with which a value of an output variable is ascertainable from a value of a variable input variable, for multiple values of the input variable respectively associated model-based values of the output variable being ascertained with the aid of vehicle dynamics model, for the multiple values of the input variable at the vehicle respectively associated vehicle-based values of the output variable being ascertained, difference values being ascertained from mutually corresponding model-based values and vehicle-based values, respectively, an updated dataset of the ascertained difference values being compared with a comparison dataset with the aid of a comparison method and a concordance measure being ascertained in the process, and the vehicle dynamics model being determined to be valid if the concordance measure meets a predefined concordance criterion.

9 Claims, 3 Drawing Sheets

(56) References Cited

OTHER PUBLICATIONS

Albert Lutz, Bernhard Schick, Henning Holzmann, Michael Kochem, Harald Meyer-Tuve, Olav Lange, Yiqin Mao & Guido Tosolin (2017) Simulation methods supporting homologation of Electronic Stability Control in vehicle variants, Vehicle System Dynamics, (Year: 2017).*

Rhode S, Gauterin F. Online estimation of vehicle driving resistance parameters with recursive least squares and recursive total least squares. In2013 IEEE Intelligent Vehicles Symposium (IV) Jun. 23, 2013 (pp. 269-276). IEEE. (Year: 2013).*

Rhode S, Von Keler J. Online validity monitor for vehicle dynamics models. In2019 IEEE International Conference on Connected Vehicles and Expo (ICCVE) Nov. 4, 2019 (pp. 1-6). IEEE. (Year: 2019).*

\* cited by examiner

METHOD FOR CHECKING A VEHICLE DYNAMICS MODEL

CROSS REFERENCE

The present application claims the benefit under 35 U.S.C. § 119 of German Patent Application No. DE 102019211951.4 filed on Aug. 8, 2019, which is expressly incorporated herein by reference in its entirety.

FIELD

The present invention relates to a method for checking a vehicle dynamics model of a vehicle, with which a value of an output variable is ascertainable from a value of a variable input variable, as well as a processing unit and a computer program for its implementation.

BACKGROUND INFORMATION

Vehicle dynamics models play a role, in particular, in the area of driver assistance systems, increasingly and generally, however, also in the area of autonomous or automated driving of vehicles, in particular, passenger vehicles or also trucks.

A vehicle dynamics model is a model of a vehicle, with which dynamic situations of the vehicle operation may be represented or modeled in such a way that a value of an output variable is ascertainable from a value of a variable input variable. One example of this would be to ascertain for a particular value of a steering angle a resulting value of a yaw rate. In this way, it is possible to predict the behavior of the vehicle at least for a certain time period.

SUMMARY

According to an example embodiment of the present invention, a method for checking a vehicle dynamics model as well as a processing unit and a computer program for its implementation are provided including the features of the independent patent claims. Advantageous embodiments of the present invention are described herein.

The present invention relates to a method for checking a vehicle dynamics model of a vehicle, with which a value of at least one output variable is ascertainable from a value of at least one variable input variable. It is understood that from values of one or of multiple input variables, corresponding values of one or of multiple output variables may be ascertained, depending on the type of vehicle dynamics model.

With such vehicle dynamics models, it is possible thus far to ascertain and, if necessary, verify various vehicle concepts, for example, before an initial operation of the vehicle, in particular, also in conjunction with the so-called homologation. A result obtained with the aid of the vehicle dynamics model in this case is assessed visually and, therefore, in particular, by an expert.

Such models may further preferably be used for predictions. Such a dynamic model may, for example, be used during autonomous driving, when multiple trajectories (potential paths) during an evasive maneuver are calculated and compared. In this case, a prediction is made for only a short time horizon, of how the vehicle behaves when various options are selected. Another case involves, for example, planning an energetically optimal negotiation of curves.

Such vehicle dynamics models are also relevant for vehicle assistance systems, in particular however also in the area of autonomous or automated driving. As has been demonstrated, an important point here is also that such a vehicle dynamics model also sufficiently accurately models or represents the actual behavior of the vehicle in a continuous manner. Otherwise, potentially different functions of the vehicle may no longer be represented or ensured—in particular, taking safety aspects into account.

It should be noted here that the actual conditions or the actual behavior of the vehicle may change over time, for example, due to wear of various components or the like. It is also possible, however, that under certain, only temporary existing conditions, a vehicle dynamics model does not sufficiently accurately model the vehicle. Modifications to the vehicle, in addition to wear, may also play a role, i.e., for example, the mounting of a roof box or of a bicycle rack or the like.

In the example method provided in accordance with the present invention, a check of such a vehicle dynamics model is performed, and it is assessed whether the vehicle dynamics model may be considered to be valid, i.e., whether it sufficiently accurately models the actual behavior of the vehicle and, therefore, can or may be (instantaneously or furthermore) used.

For multiple values of the input variable, for example, of a steering angle, respectively associated model-based values of the output variable, for example, of a yaw rate are ascertained for this purpose with the aid of the vehicle dynamics model. For the multiple values (i.e., the same values) of the input variable at the vehicle, respectively associated vehicle-based values of the output variable are also ascertained—in particular, in each case in parallel hereto. These are values otherwise ascertained, i.e., not with the aid of the vehicle dynamics model, rather real or actual values, in particular, measured values or values determined from measured values. In this respect, it is advantageous if an appropriate sensor, for example, a yaw rate sensor, is used for this purpose.

Difference values i.e., those each based respectively on the same value of the input variable, are then each ascertained from mutually corresponding model-based values and vehicle-based values, i.e., a difference is formed from a model-based and vehicle-based value. The difference values ascertained in this way then form an updated dataset. This updated dataset is then compared with a comparison dataset with the aid of a comparison method, a concordance measure being ascertained. If the concordance measure meets a predefined concordance criterion, the vehicle dynamics model is determined to be valid. Otherwise, the vehicle dynamics model is appropriately determined to be invalid.

One particular advantage of the example method provided is that it may be carried out in real time or during the drive, i.e., the difference values related to the multiple values of the input variable are ascertained preferably during an operation of the vehicle. In this way, it is possible to continuously check whether or not a particular vehicle dynamics model— the method provided may also be carried out for multiple different vehicle dynamics models used in a vehicle—can or may be instantaneously used.

The comparison dataset used may preferably be a dataset, which has been obtained in the same manner as the updated dataset, but, for example, within the scope of test measurements or during an initial operation of the vehicle or also only in another comparison period, in which it is assumed or is known that the vehicle dynamics model sufficiently accurately models the actual method.

It is also preferred if the difference values relating to the multiple values of the input variable are ascertained in temporal succession, in particular, at predetermined time intervals. In this way, the updated data set may also always be kept updated. It is particularly advantageous—and also advantageous for limiting a necessary processing power—if the updated dataset is determined only from a predetermined number of difference values, i.e., from a particular number of the difference values most recently ascertained.

At this point, it should also be mentioned that the multiple values of the input variable result, in particular, due to the actual behavior or operation of the vehicle and may therefore also be repeated. With a steering angle as the input variable, the values, for example, do not—or they at least should not, change when driving straight ahead.

The comparison of the updated dataset with the comparison dataset in this case may take place in such a way that both the updated dataset as well as the comparison dataset—each of which includes a particular number of difference values—may be used as a histogram or probability distribution or frequency distribution or may be converted into such or may be represented as such. There are suitable comparison methods for such purpose.

The comparison method is preferably a histogram difference, in particular, the so-called Jensen-Shannon divergence, or a use of such a histogram difference. The histogram difference is a positive number resulting from the formation of the difference between two histograms. It is used as a measure of the difference between two histograms and may be correspondingly also used as a measure of the concordance—i.e., a concordance measure—or a concordance measure may be ascertained therefrom. The Jensen-Shannon divergence, in particular, represents a variant or modification of the so-called Kullback-Leibler divergence and will be explained in greater detail in conjunction with the figure description.

As previously mentioned, the vehicle dynamics model is preferably determined to be invalid if the concordance measure does not meet the predefined concordance criterion. In the case of the Jensen-Shannon divergence, this means, for example, that an obtained value of the comparison method is greater than a determined comparison value or threshold value. Accordingly, the model would be considered to be valid at a value smaller than (or equal to) the comparison value or threshold value.

An error response may be initiated, in particular, in the case of a model determined to be invalid. Such an error response may, for example, encompass initiating a safety response, for example, by a limited operating mode, for a particular vehicle function, for example, for a driver assistance function or for another function for which the vehicle dynamics model is used. Conceivable as an error response is, however, also an error memory entry, a warning to the driver of the vehicle (for example, as an alert in a display means), or a switch over into another driver assistance function or the like. It is understood that such an error response may be selected depending on the type of the vehicle dynamics model and/or of its use. Multiple of the aforementioned and/or other error responses may also be initiated.

The safety of a vehicle is enhanced overall with the method provided, in particular, including driver assistance systems and especially particularly during autonomous or automated driving.

A processing unit according to the present invention, for example, a control unit of a motor vehicle is configured, in particular, programmed, to carry out a method according to the present invention.

The implementation of a method according to the present invention in the form of a computer program or computer program product having program code for carrying out all method steps is also advantageous, since this involves particularly low costs, in particular, if an executing control unit is also utilized for other tasks and is therefore already present. Suitable data media for providing the computer program are, in particular, magnetic, optical or electrical memories such as, for example, hard disks, flash memories, EEPROMs, DVDs among others. A download of a program via computer networks (Internet, Intranet, etc.) is also possible.

Additional advantages and embodiments of the present invention result from the description and from the figures.

The present invention is schematically depicted in the figures based on an exemplary embodiment and described below with reference to the figures.

DETAILED DESCRIPTION OF EXAMPLE EMBODIMENTS

Figure 1:
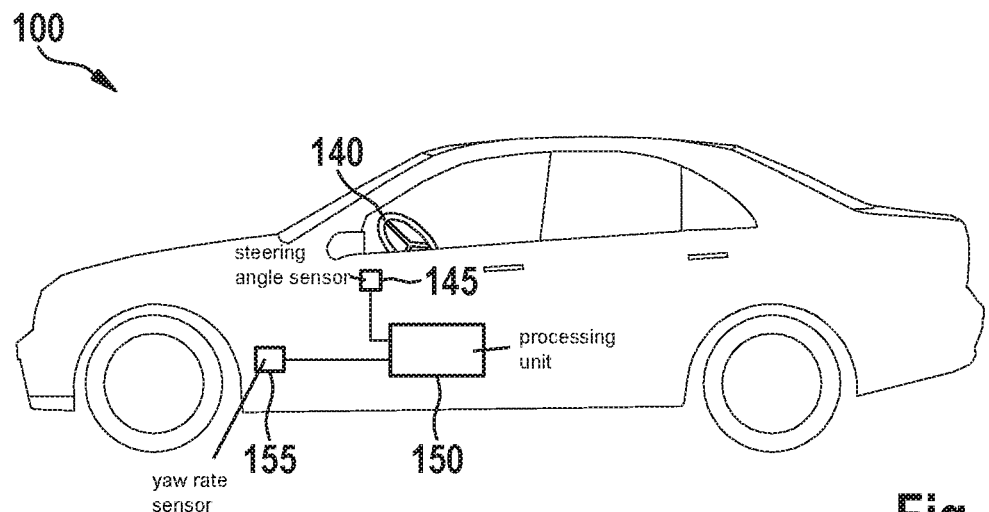
FIG. 1 schematically shows a vehicle, in which an example method according to the present invention is implementable.

FIG. 1 schematically depicts a vehicle 100, in which a method according to the present invention is implementable. A processing unit 150 on which, for example, a driver assistance system may be operated, which takes a yaw rate into consideration, is provided, for example, in vehicle 100.

For this purpose, a yaw rate sensor 155 is also provided, with the aid of which a yaw rate may be ascertained and conveyed to processing unit 150. A steering wheel 140 is also indicated, with the aid of which a steering angle may be set. The steering angle may be detected, for example, with the aid of steering angle sensor 145 and conveyed to processing unit 150. It is understood that a steering angle may be set or changed also in an automated manner in conjunction with a driver assistance function and/or in conjunction with autonomous or automated driving.

Figure 2:
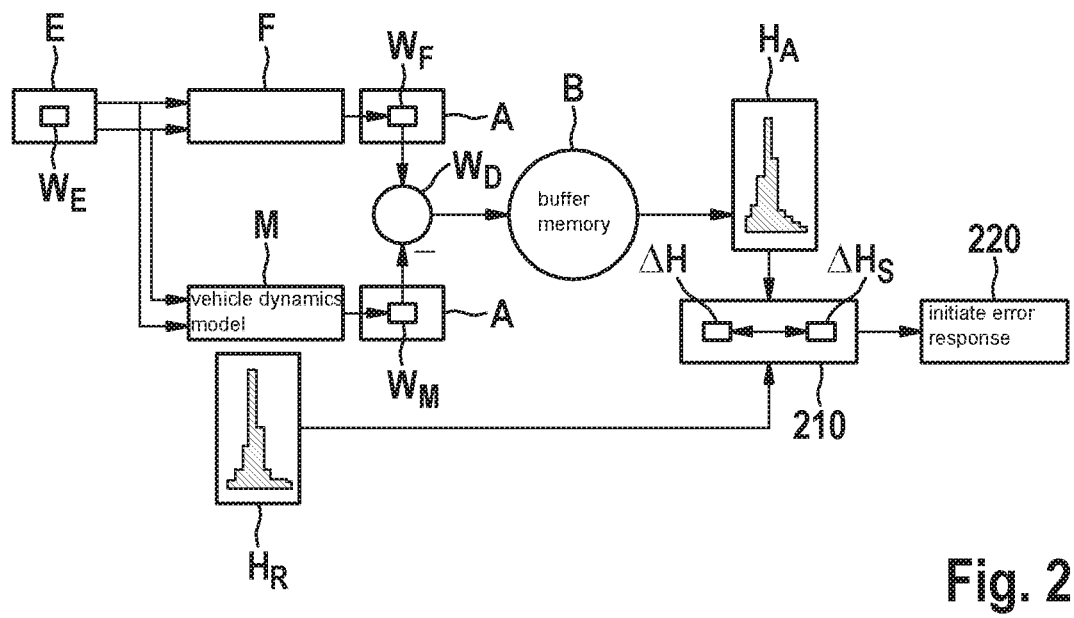
FIG. 2 schematically shows a sequence of an example method according to the present invention in one preferred specific embodiment.
Figure 3:
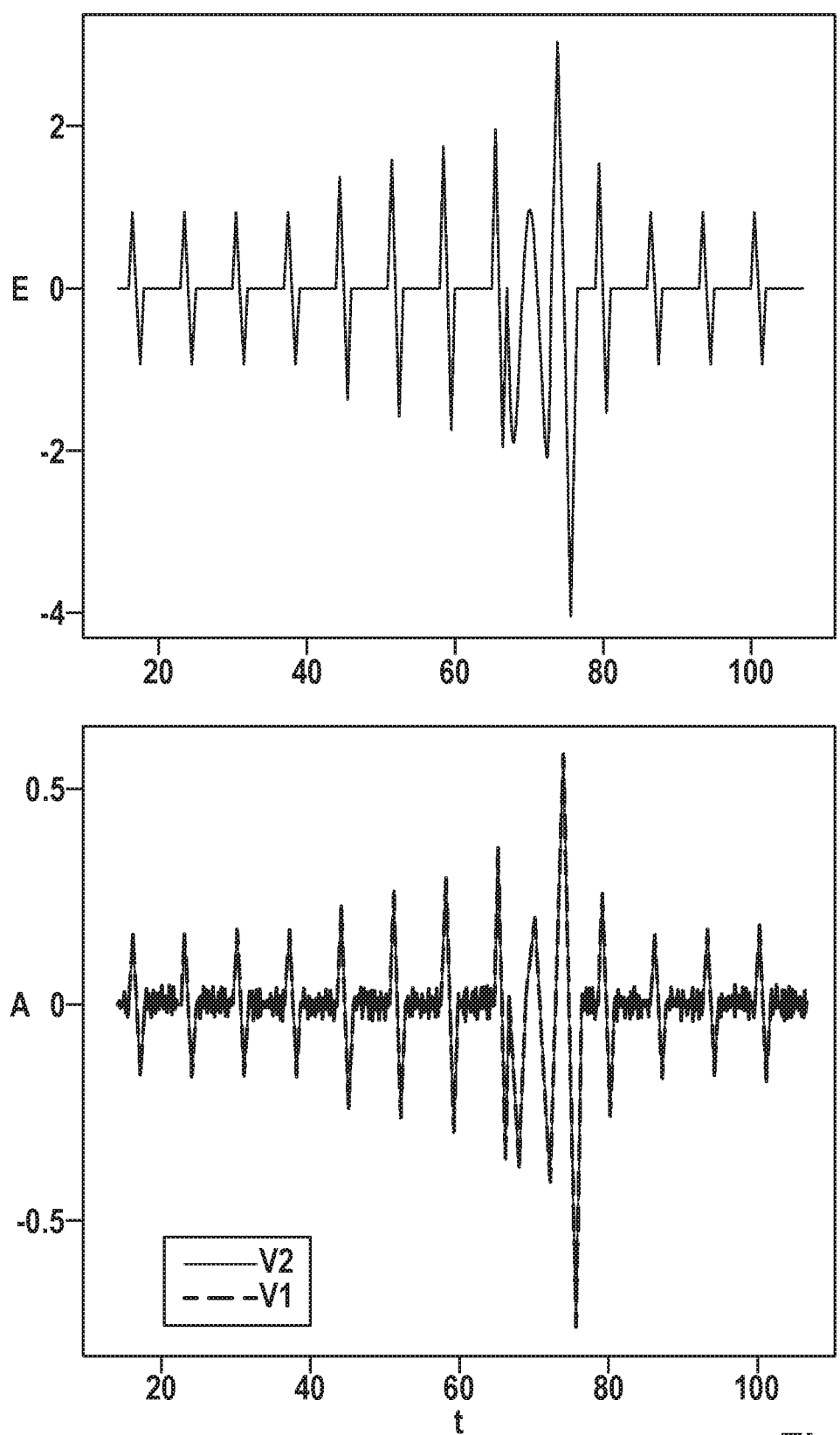
FIGS. 3 through 5 show diagrams for explaining the example method shown in FIG. 2.
Figure 4:
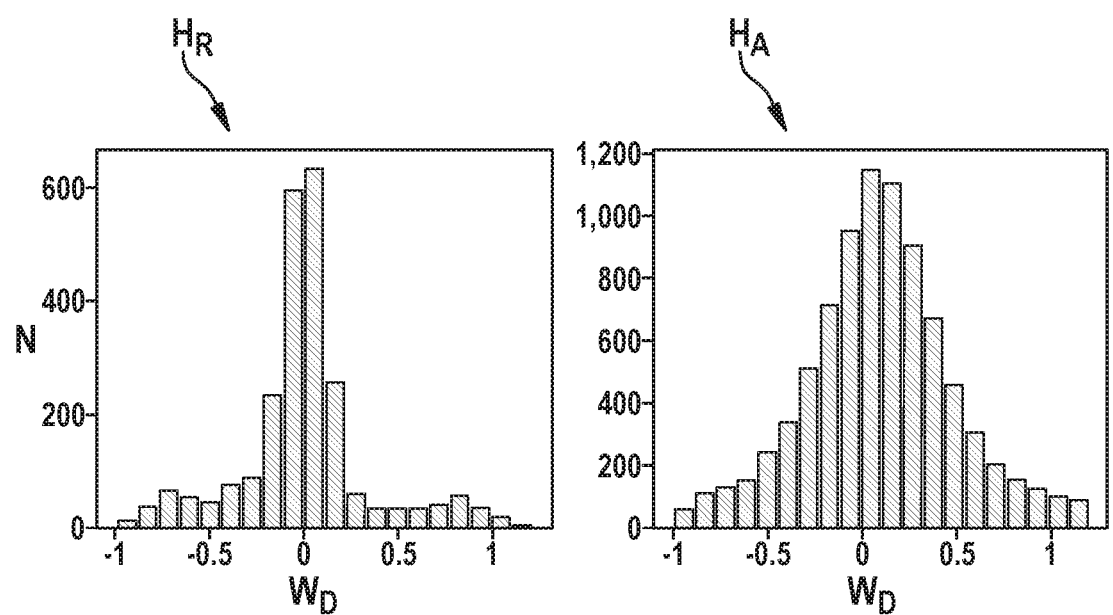
Figure 5:
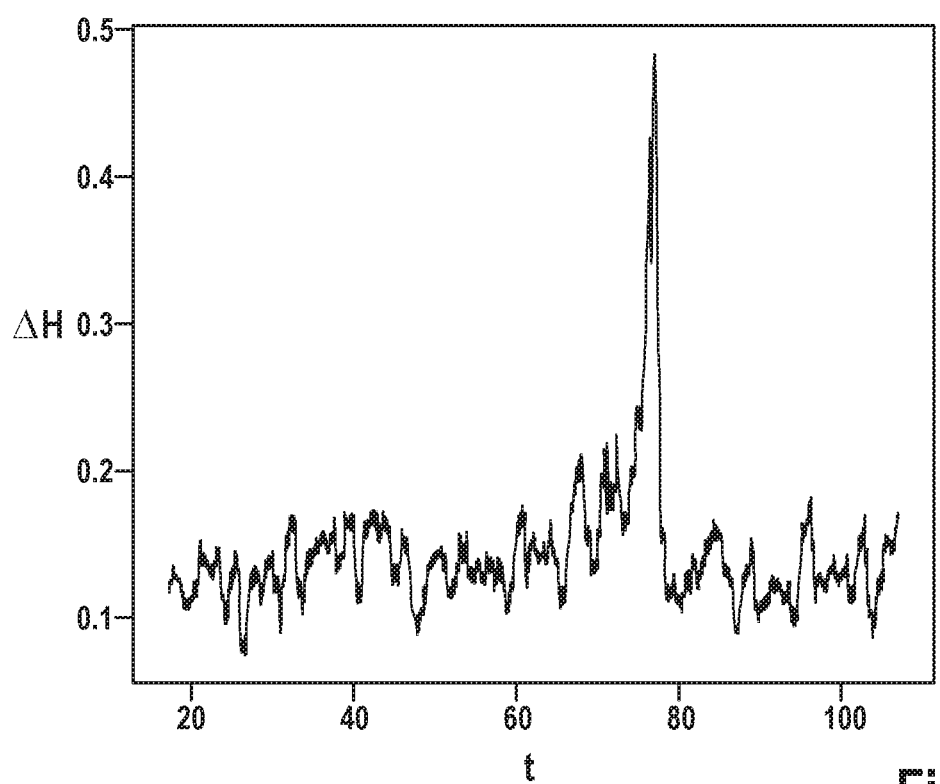

FIG. 2 schematically depicts a sequence of a method according to the present invention in one specific embodiment. This method may, for example be carried out on processing unit 150, as it is shown in FIG. 1. FIGS. 3 through 5 show diagrams for explaining the method shown in FIG. 2.

For this purpose, values $W_E$ are each detected or ascertained repeatedly or in temporal succession for one or for multiple input variables E. The input variable may, for example, be a steering angle which, or the values of which, may be ascertained as explained with reference to FIG. 1.

Based on an instantaneous value $W_E$ of the steering angle, a corresponding, vehicle-based value $W_F$ of an output variable A is then ascertained at the vehicle. The output variable A may, for example, be a yaw rate which, or the values of which, may be ascertained or measured with the aid of the yaw rate sensor as explained with reference to FIG. 1.

Based on instantaneous value $W_E$ of the steering angle, a corresponding, model-based value $W_M$ of output variable A, i.e., in this case a yaw rate, is ascertained or calculated in parallel thereto with the aid of a vehicle dynamics model M.

Such a vehicle dynamics model, with which a yaw rate $\dot{\psi}$ may be ascertained based on a steering angle $\delta$, may be represented by the following differential equations:

$$\begin{bmatrix} \ddot{\psi} \\ \dot{\beta} \end{bmatrix} = \begin{bmatrix} -\frac{1}{v}\frac{c_f l_v^2 + c_r l_r^2}{\Theta} & -\frac{c_f l_f + c_r l_r}{\Theta} \\ -1 - \frac{1}{v^2}\frac{c_f l_f + c_r l_r}{m} & -\frac{1}{v}\frac{c_f + c_r}{m} \end{bmatrix} \begin{bmatrix} \dot{\psi} \\ \beta \end{bmatrix} + \begin{bmatrix} \frac{c_f + c_f}{\Theta} \\ \frac{1}{v}\frac{c_f}{m} \end{bmatrix} \frac{\delta}{i}$$

In these equations, ß indicates a lateral slip angle, $\delta$ indicates the steering angle, i indicates the ratio between the steering angle (or steering wheel angle) and the wheel angle, v indicates the vehicle velocity, $\theta$ indicates the yaw inertia, $c_f$ and $c_r$ indicate the front and rear lateral stability of the tires, $l_f$ and $l_r$ indicate the front and rear distance between the wheel and center of gravity, and m indicates the vehicle mass. The wheel angle in this case is thus determined as a quotient of the ratio i and the steering angle $\delta$.

The values for these variables—with the exception of input variable $\delta$ and vehicle velocity v—are in this case vehicle-specific parameters and are generally known or may be measured or calculated.

For this purpose, an exemplary profile of a steering angle is depicted in the upper diagram in FIG. 3 as input variable E over time t in seconds. A corresponding profile $V_1$ for the actual or measured profile of the yaw rate as output variable A, as well as a profile $V_2$ for the profile of the yaw rate ascertained with the aid of the vehicle dynamics model, are depicted in the lower diagram. The values $W_F$ and $W_M$ may be ascertained repeatedly, for example, at an interval of one second or 100 ms, respectively.

A difference value $W_D$ is also ascertained or formed from respectively one pair of mutually corresponding values $W_F$ and $W_M$. This difference value $W_D$ is then fed to a buffer memory B, in which all difference values ascertained in this way (in temporal succession) are stored.

An updated dataset $H_A$ is then formed from these difference values $W_D$ present in buffer memory B. For this purpose, a particular number, for example, 300, the most updated or the latest difference values ascertained and stored in the buffer memory may be used, for example. In this context, it is also conceivable that only this number of values is stored or may be stored in the buffer memory, older values on the other hand are deleted or overwritten.

This updated dataset $H_A$ is then processed in the form of a histogram, i.e., of a frequency distribution. This updated dataset may then be compared in conjunction with a comparison method or a comparison step 210 with a comparison dataset or reference dataset $H_R$— also depicted in the form of a histogram. In this case, a concordance measure $\Delta H$ is ascertained and then compared with a predefined threshold value $\Delta H_s$.

For this purpose, FIG. 4 depicts a comparison dataset $H_R$ on the left and an updated dataset $H_A$ on the right, each in the form of a histogram. Here, a number N of difference values is plotted over a value of difference values $W_D$ in $10^{-2}$ in each case. For comparing, the two histograms must, if necessary, still be standardized.

The comparison method is explained briefly and by way of example below with reference to the previously mentioned Jensen-Shannon divergence. This divergence is based on the so-called Kullback-Leibler divergence. The Kullback-Leibler divergence measures to what degree a probability distribution P(x) differs from a second probability distribution Q(x). The Kullback-Leibler divergence $D_{KL}$ for discrete probability distributions in the same probability space is defined in this case as follows:

$$D_{KL}(P \| Q) = \sum_{x \in X} P(x) \log\left(\frac{P(x)}{Q(x)}\right)$$

The Kullback-Leibler divergence is always not negative, i.e., $D_{KL}(P\|Q) \geq 0$, but neither finite nor symmetrical. In practice, therefore, the sum of the two Kullback-Leibler divergences $$D_{KL2}(P\|Q) = D_{KL2}(Q\|P) = D_{KL}(P\|Q) + D_{KL}(P\|Q)$$

is often applied in order to ensure the symmetry. However, the infinite values of the Kullback-Leibler divergence result in problems in the practical implementation. For this reason, the so-called Jensen-Shannon divergence $D_{JS}$ is preferred, which is symmetrical and limited and is based on the Kullback-Leibler divergence as follows:

$$D_{JS}(P\|Q) = \tfrac{1}{2} D_{KL}(P\|M) + \tfrac{1}{2} D_{KL}(Q\|M)$$

where $M = 0.5 \cdot (P+Q)$ applies. The result of a comparison of updated dataset $H_A$ and comparison dataset $H_R$, which represent the histograms or frequency distributions P and Q in the above notation, is a concordance measure (or divergence measure) $\Delta H$, in the case of the Jensen-Shannon divergence, a positive number.

FIG. 5 shows a profile of such a concordance measure (or divergence measure) $\Delta H$ over time t in seconds, as results for the profiles of the output variables in the lower diagram of FIG. 3. In this case, it is clearly apparent that the concordance measure $\Delta H$ increases sharply, in particular in the area of the unusual and sharp steering angle changes between the points in time 70 and 80 seconds.

In the present case, a value of 0.25, for example, may be selected as threshold value $\Delta H_s$, the vehicle dynamics model being determined to be valid if the concordance measure is below the threshold value, i.e., if: $\Delta H < \Delta H_s$ applies.

In a step 220, an error response may then be initiated if the vehicle dynamics model is not determined to be valid or is determined to be invalid, as previously explained in detail above. If, however, the vehicle dynamics model is determined to be valid, it may be used as usual for desired functions.

As is apparent from FIG. 5, it may therefore also happen that the vehicle dynamics model is determined to be only temporarily invalid and is then not used during this time period. Later, however, it may then be used again, for example.

What is claimed is:

1. A method for checking a vehicle dynamics model of a vehicle, with which a value of an output variable is ascertainable from a value of a variable input variable, the method being executed on a processing unit installed in the vehicle which is coupled to a steering angle sensor of the vehicle and to a yaw-rate sensor of the vehicle, and the method comprising the following steps:

during operation of the vehicle as the vehicle is driving and in real-time, performing the following steps:
detecting using the steering angle sensor of the vehicle, a plurality of steering angles of the vehicle;
for multiple values of the input variable, ascertaining respectively associated model-based values of the output variable using the vehicle dynamics model, wherein the multiple values of the input variable are the plurality of steering angles detected by the steering angle sensor;

for the multiple values of the input variable at the vehicle, ascertaining, in parallel with the detecting using the steering angle sensor, respectively associated vehicle-based values of the output variable, wherein the vehicle-based values of the output variable are ascertained using the yaw-rate sensor of the vehicle;

respectively ascertaining difference values for mutually corresponding ones of the model-based values and the vehicle-based values;

comparing an updated dataset of the ascertained difference values with a comparison dataset using a comparison method and ascertaining a concordance measure based on the comparing;

determining the vehicle dynamics model to be valid based on the concordance measure meeting a predefined concordance criterion; and based on determining the vehicle dynamics model to be valid, using the vehicle dynamics model by a driver assistance function of the vehicle;

wherein the vehicle dynamics model predicts a behavior of the vehicle based on the plurality of detected steering angles.

2. The method as recited in claim 1, wherein the difference values are ascertained repeatedly in temporal succession at predetermined time intervals, during operation of the vehicle while the vehicle is driving.

3. The method as recited in claim 2, wherein the updated dataset is determined only from a predetermined number of the difference values.

4. The method as recited in claim 1, wherein a histogram difference is used as the comparison method.

5. The method as recited in claim 1, wherein a Jensen-Shannon divergence is used as a comparison method.

6. The method as recited in claim 1, wherein the vehicle dynamics model is determined to be invalid when the concordance measure does not meet the predefined concordance criterion, and an error response is then initiated.

7. The method as recited in claim 1, wherein the vehicle dynamics model is used for vehicle functions based on the vehicle dynamics model being determined to be valid.

8. A processing unit configured to check a vehicle dynamics model of a vehicle, with which a value of an output variable is ascertainable from a value of a variable input variable, the processing unit, when installed in the vehicle and coupled to a steering angle sensor of the vehicle and a yaw-rate sensor of the vehicle, configured to:

during operation of the vehicle as the vehicle is driving and in real-time, the processor being configured to:

detect using the steering angle sensor of the vehicle, a plurality of steering angles of the vehicle;

for multiple values of the input variable, ascertain respectively associated model-based values of the output variable using the vehicle dynamics model, wherein the multiple values of the input variable are the plurality of steering angles detected by the steering angle sensor;

for the multiple values of the input variable at the vehicle, ascertain, parallel with the detection using the steering angle sensor, respectively associated vehicle-based values of the output variable, wherein the vehicle-based values of the output variable are ascertained using the yaw-rate sensor of the vehicle;

respective ascertain difference values for mutually corresponding ones of the model-based values and the vehicle-based values;

compare an updated dataset of the ascertained difference values with a comparison dataset using a comparison method and ascertaining a concordance measure based on the comparing;

determine the vehicle dynamics model to be valid based on the concordance measure meeting a predefined concordance criterion;

based on determining the vehicle dynamics model to be valid, using the vehicle dynamics model by a driver assistance function of the vehicle; and wherein the vehicle dynamics model predicts a behavior of the vehicle based on the plurality of detected steering angles.

9. A non-transitory machine-readable memory medium on which is stored a computer program for checking a vehicle dynamics model of a vehicle, with which a value of an output variable is ascertainable from a value of a variable input variable, the computer program, when executed by a computer installed in the vehicle and coupled to a steering angle sensor of the vehicle and a yaw-rate angle-sensor of the vehicle, causing the computer to perform the following steps:

during operation of the vehicle as the vehicle is driving and in real-time, performing the following steps:

detecting using the steering angle sensor of the vehicle, a plurality of steering angles of the vehicle;

for multiple values of the input variable, ascertaining respectively associated model-based values of the output variable using the vehicle dynamics model, wherein the multiple values of the input variable are the plurality of steering angles detected by the steering angle sensor;

for the multiple values of the input variable at the vehicle, ascertaining, in parallel with the detecting using the steering angle sensor, respectively associated vehicle-based values of the output variable, wherein the vehicle-based values of the output variable are ascertained using the yaw-rate sensor of the vehicle;

respectively ascertaining difference values for mutually corresponding ones of the model-based values and the vehicle-based values;

comparing an updated dataset of the ascertained difference values with a comparison dataset using a comparison method and ascertaining a concordance measure based on the comparing;

determining the vehicle dynamics model to be valid based on the concordance measure meeting a predefined concordance criterion;

based on determining the vehicle dynamics model to be valid, using the vehicle dynamics model by a driver assistance function of the vehicle; and wherein the vehicle dynamics model predicts a behavior of the vehicle based on the plurality of detected steering angles.

\* \* \* \* \*